US011631682B2

(12) United States Patent
Chiu et al.

(10) Patent No.: US 11,631,682 B2
(45) Date of Patent: Apr. 18, 2023

(54) METAL ISOLATION TESTING IN THE CONTEXT OF MEMORY CELLS

(71) Applicant: Taiwan Semiconductor Manufacturing Co., Ltd., Hsin-Chu (TW)

(72) Inventors: Te-Hsin Chiu, Miaoli County (TW); Meng-Han Lin, Hsinchu (TW); Wei Cheng Wu, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 456 days.

(21) Appl. No.: 16/860,234

(22) Filed: Apr. 28, 2020

(65) Prior Publication Data

US 2020/0258892 A1 Aug. 13, 2020

Related U.S. Application Data

(62) Division of application No. 15/903,770, filed on Feb. 23, 2018, now Pat. No. 10,665,595.

(60) Provisional application No. 62/552,191, filed on Aug. 30, 2017.

(51) Int. Cl.
*H01L 27/11* (2006.01)
*G06F 30/398* (2020.01)
(Continued)

(52) U.S. Cl.
CPC ......... *H01L 27/1104* (2013.01); *G06F 30/39* (2020.01); *G06F 30/398* (2020.01);
(Continued)

(58) Field of Classification Search
CPC .................. G06F 30/398; H01L 27/1104
(Continued)

(56) References Cited

U.S. PATENT DOCUMENTS 8,294,212 B2 10/2012 Wang et al.
9,450,512 B2 9/2016 Bremicker et al.
(Continued)

FOREIGN PATENT DOCUMENTS

KR 20050030347 A 3/2005
TW 310374 B 7/1997

OTHER PUBLICATIONS

Notice of Allowance dated Jan. 21, 2020 for U.S. Appl. No. 15/903,770.

*Primary Examiner* — Suchin Parihar
(74) *Attorney, Agent, or Firm* — Eschweiler & Potashnik, LLC

(57) ABSTRACT

In the present disclosure, it has been appreciated that memory structures, such as static random access memory (SRAM) structures, have feature densities that are extremely high. While this is beneficial in allowing the memory structures to store large amounts of data in a small chip footprint, it is potentially detrimental in that it makes the memory structures more susceptible to leakage current than the other areas of the chip. Accordingly, the present disclosure provides pseudo memory structures which are similar in terms of layout spacing to actual memory structures. However, rather than being used as actual memory structures that store data during operation, these pseudo memory structures are used to characterize leakage current in the design of the IC and/or to characterize the fabrication process used to manufacture the IC.

20 Claims, 10 Drawing Sheets

(51) Int. Cl.
*H01L 23/528* (2006.01)
*G11C 29/50* (2006.01)
*G11C 29/08* (2006.01)
*G11C 29/04* (2006.01)
*G11C 29/12* (2006.01)
*G06F 30/39* (2020.01)

(52) U.S. Cl.
CPC ............ *G11C 29/04* (2013.01); *G11C 29/08* (2013.01); *G11C 29/12005* (2013.01); *G11C 29/50* (2013.01); *H01L 23/528* (2013.01); *G11C 2029/0403* (2013.01); *G11C 2029/1206* (2013.01); *G11C 2029/5006* (2013.01)

(58) Field of Classification Search
USPC ......................................................... 716/110
See application file for complete search history.

(56) References Cited

U.S. PATENT DOCUMENTS

| | | | |
|---|---|---|---|
| 2005/0111272 A1* | 5/2005 | Hong ................... | G11C 29/50 365/201 |
| 2006/0012391 A1 | 1/2006 | Huang | |
| 2006/0256632 A1* | 11/2006 | Hong ................... | G11C 29/50 365/201 |
| 2007/0109852 A1 | 5/2007 | Ko et al. | |
| 2007/0223297 A1 | 9/2007 | Hirota et al. | |
| 2008/0062746 A1* | 3/2008 | Loh ....................... | G11C 29/50 365/201 |
| 2009/0014718 A1 | 1/2009 | Hong | |
| 2010/0013514 A1 | 1/2010 | Lee et al. | |
| 2010/0201376 A1 | 8/2010 | Ouyang et al. | |
| 2015/0029783 A1* | 1/2015 | Cai ...................... | G11C 29/50008 365/154 |
| 2016/0266200 A1 | 9/2016 | Mikalo | |

* cited by examiner

METAL ISOLATION TESTING IN THE CONTEXT OF MEMORY CELLS

REFERENCE TO RELATED APPLICATIONS

This Application is a Divisional of U.S. application Ser. No. 15/903,770, filed on Feb. 23, 2018, which claims the benefit of U.S. Provisional Application No. 62/552,191, filed on Aug. 30, 2017. The contents of the above-referenced Patent Applications are hereby incorporated by reference in their entirety.

BACKGROUND

Moore's law refers to an observation made by Intel co-founder Gordon Moore in 1965. He noticed that the number of transistors per square inch on integrated circuits had doubled every year since their invention. Thus, each year the feature size imprinted on integrated circuits decreases compared to that of the previous year, and adjacent transistors are spaced more and more closely than the previous year. Though the increased transistor density increases the functionality for the final IC, the close proximity of adjacent transistors may result the transistors suffering from poor metal layer isolation or result in leakage current between devices, which degrades performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A illustrates lower layers of the layout view while FIG. 2B illustrates upper layers of the layout view.

DETAILED DESCRIPTION

Figure 1A:
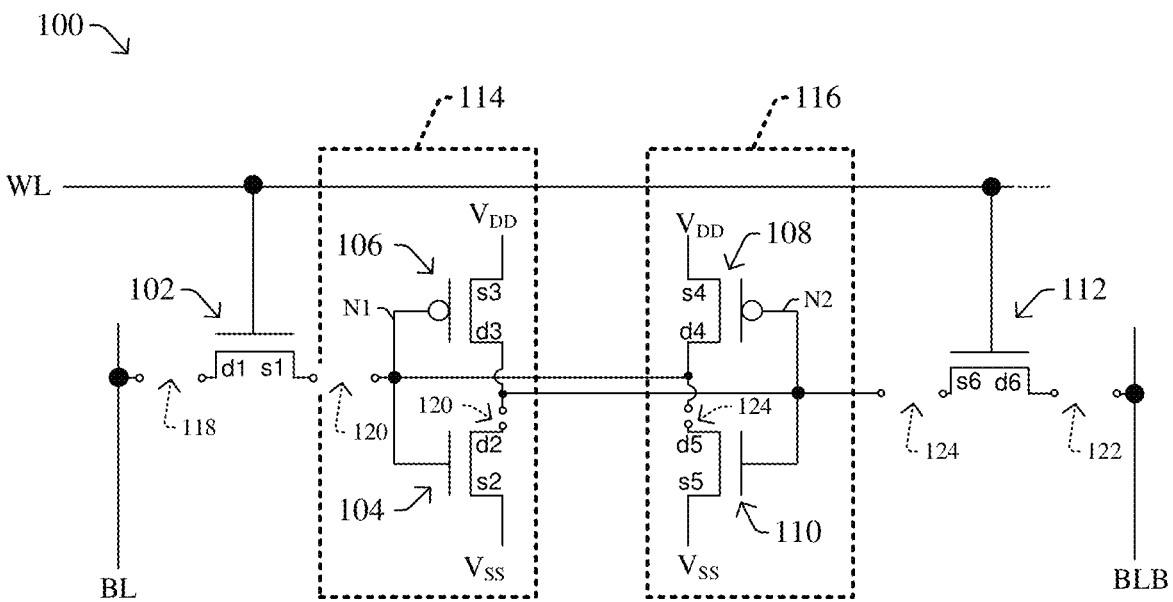
FIG. 1A illustrates a schematic view of some embodiments of a metal isolation test circuit that is analogous to a static random access memory (SRAM) cell with several contacts removed.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element may be referred to as a "first" element in some embodiments, the element may be referred to as a "second" element in other embodiments.

Integrated circuits typically include millions or billions of transistors disposed in or over a semiconductor substrate. Each transistor typically includes a pair of source/drain regions, which are highly doped regions that are implanted into the substrate or epitaxially grown in or over the substrate, and a gate region arranged between the source/drain regions. A back-end-of-line (BEOL) metallization stack is disposed over the substrate, and electrically couples the transistors to one another to implement desired functionality. The BEOL metallization stack comprises a plurality of conductive interconnect layers which are arranged over the semiconductor substrate and isolated from one another by inter layer dielectric (ILD) layers. In various embodiments, the ILD layers may comprise one or more of a low-k dielectric layer (i.e., a dielectric with a dielectric constant less than about 3.9), an ultra-low-k dielectric layer, or an oxide (e.g., silicon dioxide). The plurality of conductive interconnect layers comprise alternating layers of metal wires and metal vias. The metal layers are typically assigned names that are incremented to reflect their position in the BEOL stack. For example, a metal1 (or metal0) layer is closest to the substrate, a metal2 layer can be formed over the metal1 layer, a metal3 layer can be formed over the metal2 layer, and so on. Each metal layer includes wires that, in combination with wires on the other metal layers, connect the transistors to one another according to a circuit schematic.

Transistors and their BEOL metallization features are becoming more densely packed as technology nodes go to smaller feature sizes. This increased density provides ICs with more functionality for a given footprint, and tends to reduce operating voltages and power consumption for each transistor. However, the increased density also gives rise to the potential for increased leakage current between the transistors and/or within the BEOL metallization features. This increased risk for leakage current may arise, for example, due to the fact that adjacent metal wires in a metal1 layer are extremely close together, such that electrons can inadvertently "leak" from one metal1 wire to a neighboring metal1 wire. For example, during operation of the integrated circuit, biases between various transistors and/or between vias and/or metal wires within the BEOL interconnect structure are biased to different voltages. Depending on the voltage conditions present and the integrity of the dielectric structure, undesirable leakage current can occur between the transistors and/or between vias and/or metal wires within the BEOL interconnect structure. This leakage current can degrade device performance. Therefore, due to the number and density of transistors that are fabricated on a wafer, testing for leakage current is important to accurately characterize the IC design itself and/or to accurately characterize the fabrication processed used to manufacture the IC design.

In the present disclosure, it has been appreciated that memory structures, such as static random access memory (SRAM) structures, have feature densities that are extremely high. This is because the memory structures often use different design rules from other areas on the chip (e.g., SRAM on a chip has different design rules than logic areas on the chip), which facilities ultra-dense layouts for the memory structures. While this is beneficial in allowing the memory structures to store large amounts of data in a small chip footprint, it is potentially detrimental in that it makes the memory structures more susceptible to leakage current than the other areas of the chip. The present disclosure in various embodiments makes use of this and provides pseudo memory structures which are similar in terms of layout spacing to actual memory structures. However, rather than being used as actual memory structures that store data during operation, these pseudo memory structures are used solely to characterize leakage current in the design of the IC and/or to characterize the fabrication process used to manufacture the IC. For example, pseudo SRAM structures may include transistors that are laid out to have the same locations, sizings, and shapes as that of actual SRAM cells, however the operable coupling of the transistors in the pseudo SRAM structures may be "broken" relative to an actual SRAM cell—for example contacts may be selectively removed from the layout of the pseudo SRAM structures. Removing the contacts allows various bias conditions to be applied to these pseudo SRAM structures, and leakage current for these pseudo SRAM structures is measured for each bias condition. In this way, the pseudo SRAM structures of the present disclosure facilitate characterization of leakage current for a design (e.g., actual SRAM cell) as well as the manufacturing process by which the design is manufactured. For example, if there is a quality issue by which an ILD layer is formed between metal1 and metal2, the pseudo SRAM structures and testing methods provided herein may be able to detect this issue, and allow the IC design and/or manufacturing process to be revised to alleviate this issue.

FIG. 1A illustrates a schematic view of some embodiments of a metal isolation test circuit 100, which has a schematic and layout that is substantially the same as an SRAM cell but with various conductive pathways removed to allow for test biasing to be applied. Thus, FIG. 1A is an example of a pseudo SRAM cell or structure. The metal isolation test circuit 100 is made up of six transistors, including a first n-type access transistor 102 and a second n-type access transistor 112. The metal isolation test circuit 100 also includes first n-type data storage transistor 104, second n-type data storage transistor 110, first p-type data storage transistor 106, and second p-type data storage transistor 108. Each transistor has a source (e.g., first transistor 102 has source s1, second transistor 104 has source s2, and so on), and each transistor has a drain (e.g., first transistor 102 has drain d1, second transistor 104 has drain d2, and so on).

The first n-type data storage transistor 104 and the first p-type data storage transistor 106 form a first pseudo-inverter 114 and the second n-type transistor 110 and the second p-type transistor 108 form a second pseudo-inverter 116. The first pseudo-inverter 114 is cross-coupled with the second pseudo-inverter 116, thereby establishing complementary data storage nodes N1, N2. Wordline (WL) is coupled to the gates of access transistors 102, 112, and a pair of complementary bitlines BL, BLB extend along outer edges of the cell.

Figure 1B:
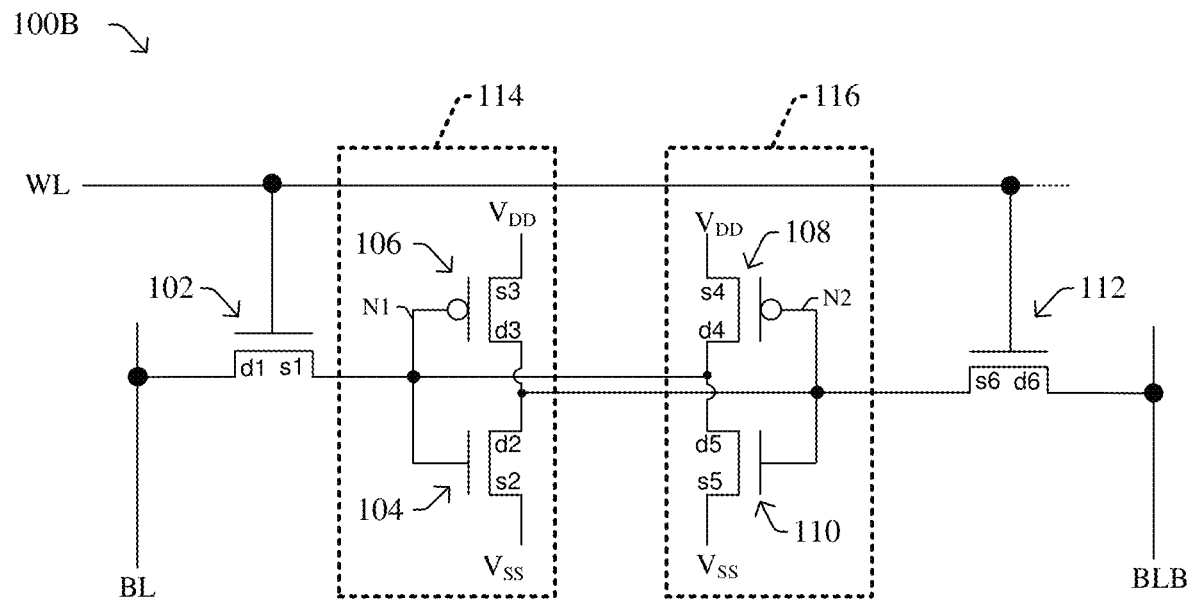
FIG. 1B illustrates a schematic view of some embodiments of an SRAM cell in accordance with some embodiments.

In an actual SRAM cell 100B (shown in FIG. 1B), bitline BL is coupled to a source region (s1) of first access transistor 102, and can be selectively coupled to the first data storage node N1 by assertion of the wordline WL. However, in the present metal isolation test circuit 100 of FIG. 1A, BL is spaced apart from the drain (d1) of the first access transistor 102 by gap 118, and storage node N1 is spaced apart from the source (s1) of the first access transistor 102 by gap 120. Similarly, in the actual SRAM cell 100B of FIG. 1B, bitline-bar BLB is coupled to a drain of second access transistor 112, and can be selectively coupled to the second data storage node N2 by assertion of the wordline WL. However, in the present metal isolation test circuit 100 of FIG. 1A, BLB is spaced apart from the drain d6 of the second access transistor 112 by gap 122, and storage node N2 is spaced apart from the source s6 of the second access transistor 112 by gap 124. Thus, relative to an actual SRAM cell, various conductive pathways have been removed in the pseudo SRAM cell of FIG. 1A.

As will be appreciated in more detail below, the gaps 118, 120, 122, 124 facilitate various bias conditions to be applied to the metal isolation test circuit 100 to allow for metal isolation testing to be applied. The application of these bias conditions allow for leakage current within this metal isolation test circuit 100 to be measured in a reliable way during testing. Moreover, because the metal isolation test circuit is laid out according to SRAM layout design rules, the feature sizes and spacing between the conductive features is very small and gives a better assessment of leakage current than if other larger features (e.g., logic circuits on the chip) were evaluated for leakage current.

It will be appreciated that in some embodiments, the metal isolation test circuit 100 is disposed in a first region of the IC, while one or more SRAM cells 100B are disposed in a second region of the IC. Thus, the IC can include one or more fully functional SRAM cells 100B and one or more metal isolation test circuits 100, both of which are verified using a first set of design rules that is optimized to allow for ultra-dense feature sizes and small spacings. The IC can also include logic circuits and/or other circuits, which are verified using a second set of design rules that does not allow for features as small or densely packed as the SRAM cells and metal isolation test circuits. Thus, the logic and/or other circuits have feature sizes that are larger and less densely packed on the IC compared to the SRAM cells and metal isolation circuits.

Figure 2A:
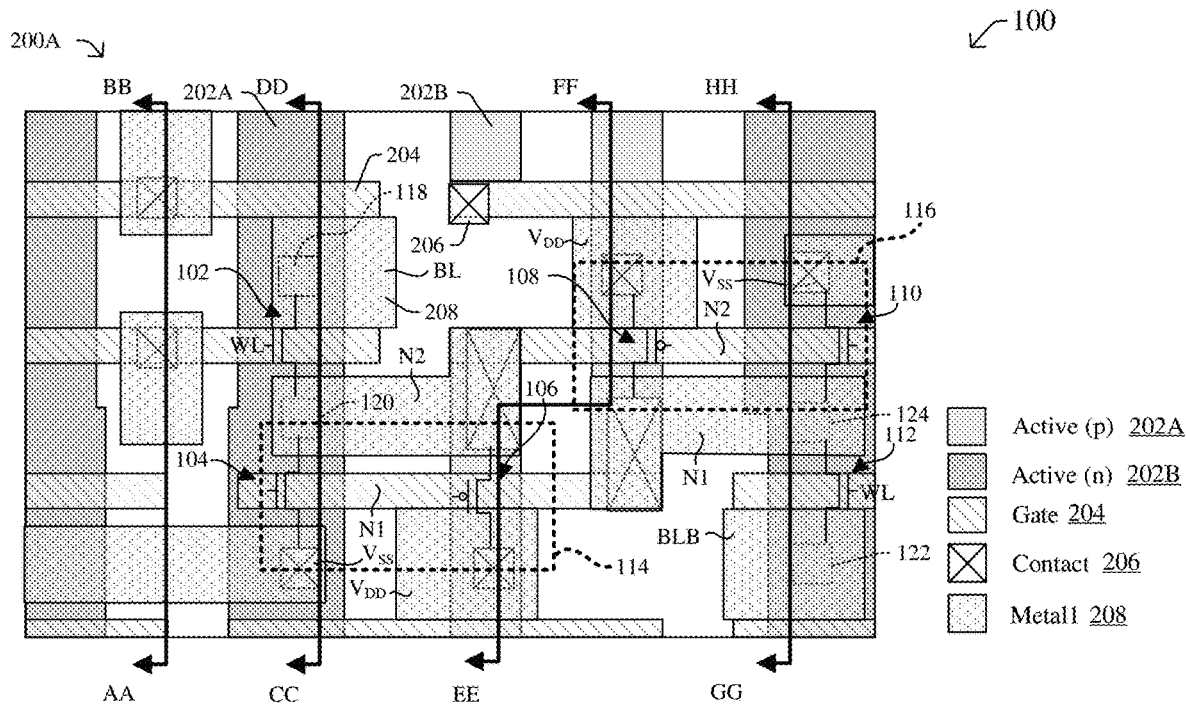
FIGS. 2A-2B illustrate a layout view of some embodiments of a metal isolation test circuit consistent with FIG. 1A.
Figure 2B:
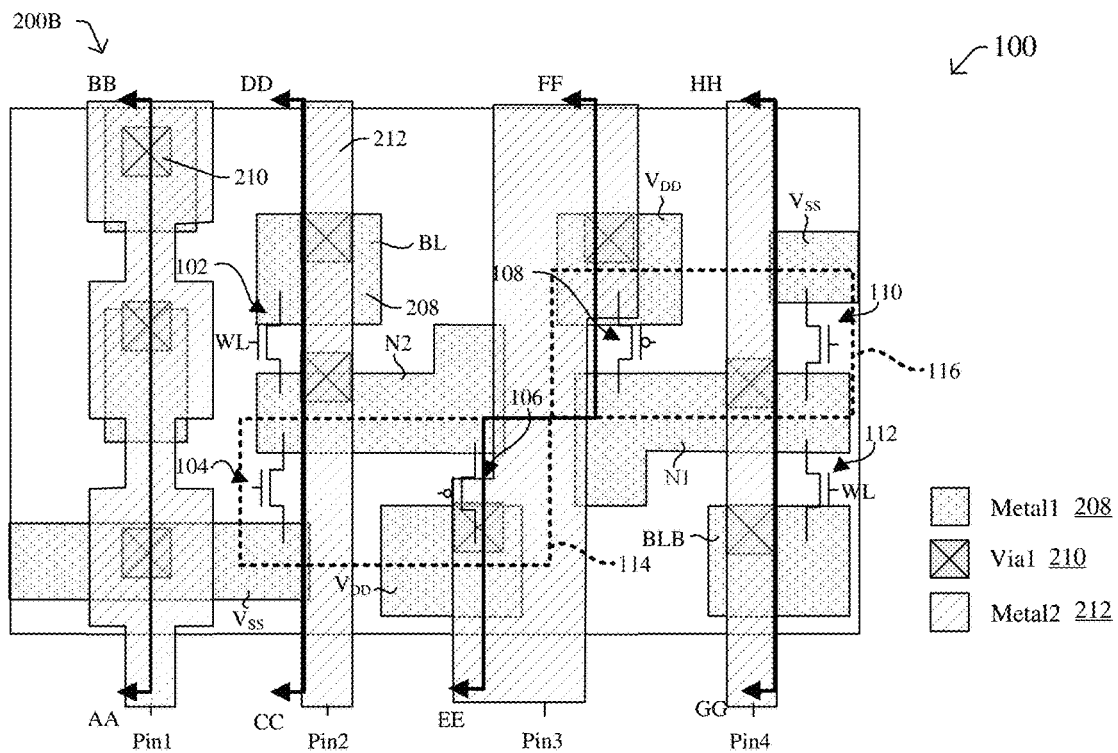
Figure 3A:
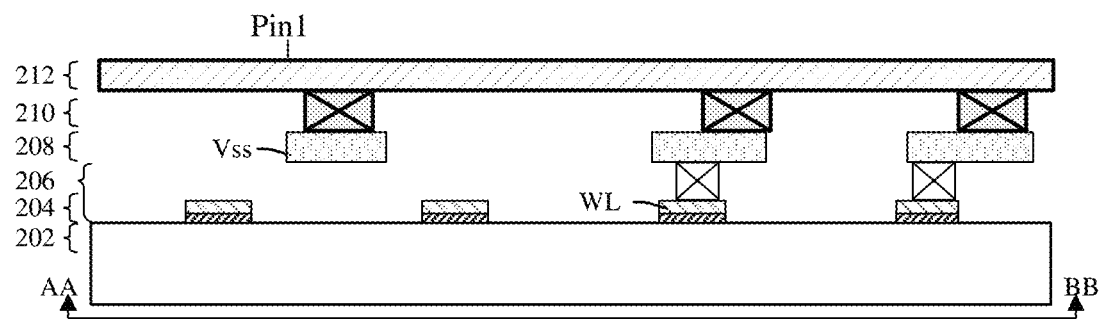
FIGS. 3A-3D illustrate a series of cross-sectional views corresponding to the layout view of FIGS. 2A-2B.
Figure 3B:
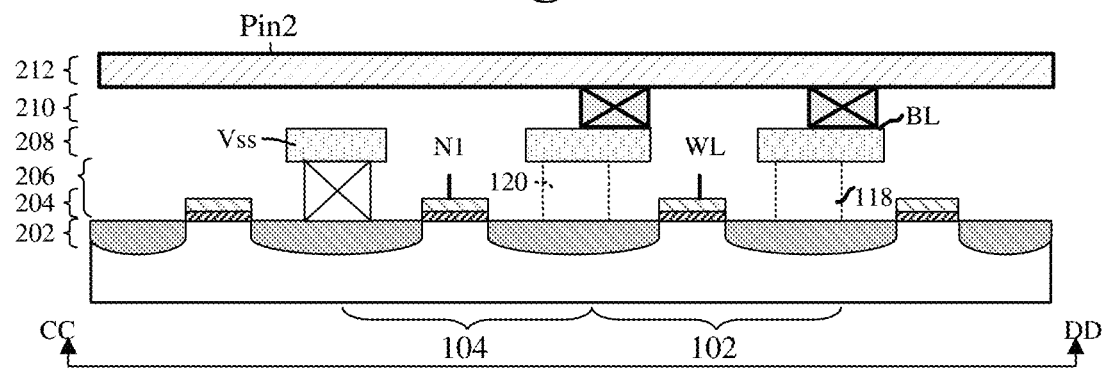
Figure 3C:
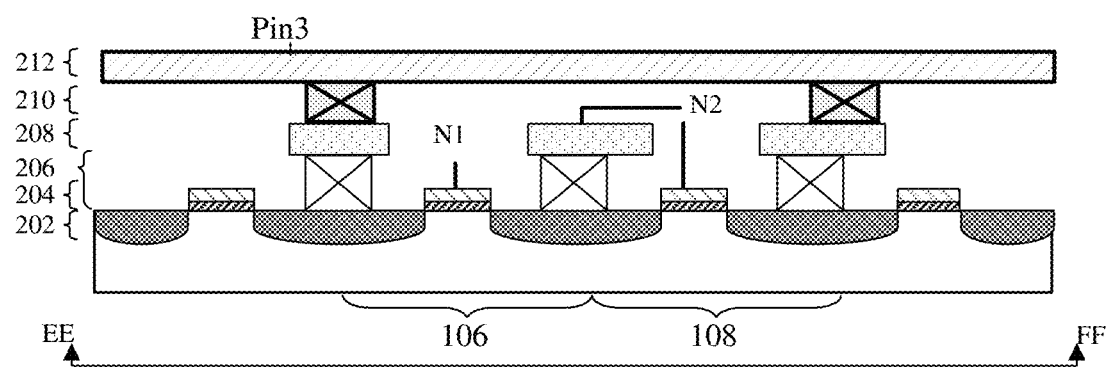
Figure 3D:
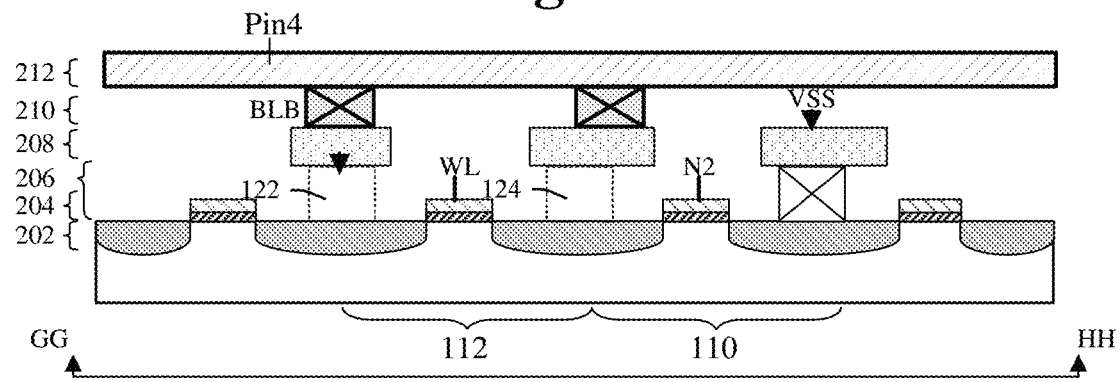

FIGS. 2A-2B provide layout views 200A, 200B consistent with some embodiments of the metal isolation test circuit 100. More particularly, FIG. 2A illustrates lower layers 200A of the layout, while FIG. 2B illustrates upper layers 200B of the layout. The lower layers in FIG. 2A include an active layer 202, gate layer 204, contact layer 206, and metal 1 layer 208. The upper layers in FIG. 2B include the metal1 layer 208, vias 210, and metal2 layer 212. Thus, the upper layers 200B can be superimposed over the lower layers 200A to provide a layout made up of six transistors 102, 104, 106, 108, 110, and 112, which are operably coupled consistent with FIG. 1's schematic view. For clarity, in FIGS. 2A-2B, metal1 layer 208 has been reproduced in both layouts 200A, 200B to clearly depict alignment of the various features/layers with one another, and it will be appreciated that additional layers may also be present but have been omitted for purposes of clarity.

Referring to FIG. 2A, the transistors 102, 104, 106, 108, 110, and 112 in FIG. 2A (which correspond to the same transistors in FIG. 1A's schematic) are formed by active regions 202 bridged by a gate layer 204. The active regions 202 include p-type active regions 202A and n-type active regions 202B. The longitudinal axes of the active regions 202 of the transistors 102, 104, 106, 108, 110, and 112 are parallel. The gate layer 204 runs across the longitudinal axes of the active regions 202. In addition to forming the gates of transistors 102, 104, 106, 108, 110, and 112, the gate layer 204 interconnects the transistors 102, 104, 106, 108, 110, and 112 by coupling common gate terminals together. The gate layer 204 may be made of polysilicon and/or metal, depending on the implementation. Contacts 206 electrically couple the active regions 202 and/or gate layer 204 to first metal lines 208 (e.g., metal1 layer).

Figure 5:
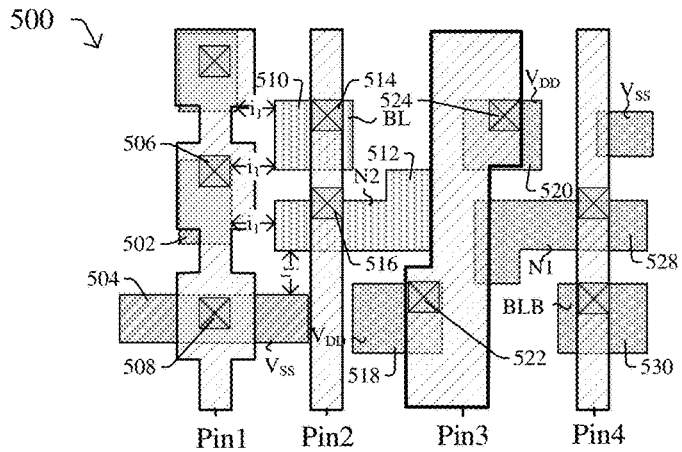
FIGS. 5-7 illustrate a series of layout views of some embodiments of a flow for using a metal isolation test circuit consistent with FIG. 4.
Figure 6:
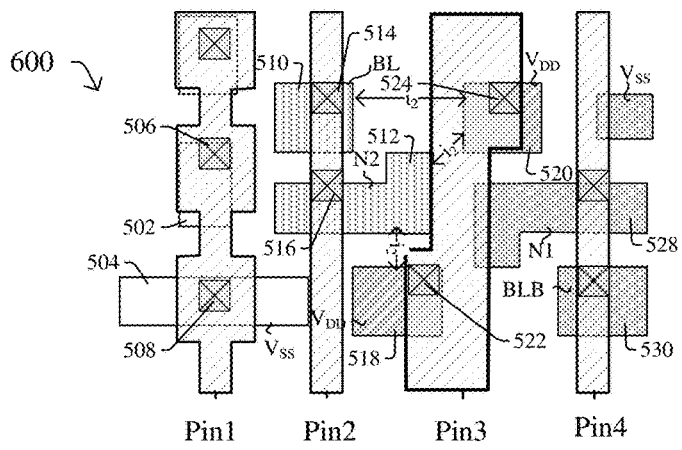
Figure 7:
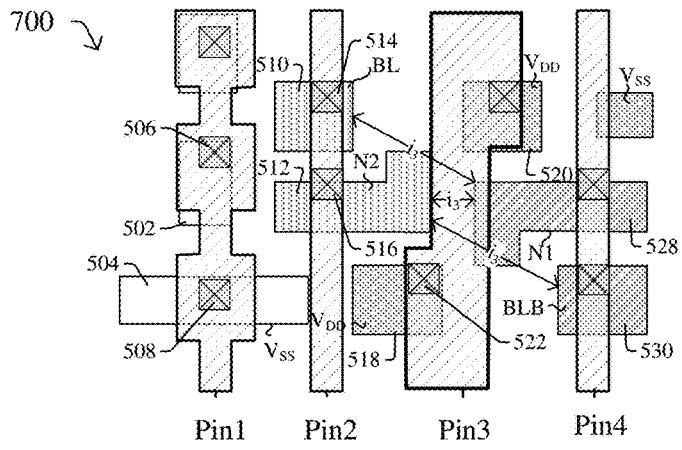

Referring to FIG. 2B, vias 210 electrically couple the first metal lines 208 (e.g., metal1 layer) to second metal lines 212 (e.g., metal2 layer). As can be seen in FIG. 2B, nearest neighboring metal1 lines have edges that are closely spaced. Further the metal2 lines correspond to pins by which voltage biases can be applied, namely: first pin (pin1), second pin (pin 2), third pin (pin3), and fourth pin (pin4). FIGS. 5-7 described further herein will describe how biases are applied to these pins to test for leakage current.

Before turning to FIGS. 5-7, however, FIGS. 3A-3D illustrate cross-sectional views of the metal isolation test circuit 100 as shown along the cross-sectional lines illustrated in FIGS. 2A-2B. As shown in FIGS. 3A-3D, the active layer 202 can be formed in the semiconductor substrate 302 and the gate layer 204 can be formed above the substrate and can include a gate dielectric (e.g., 304) and a conductive gate electrode (e.g., 306). A metal1 layer 208 can be disposed over the gate layer 204, and a metal2 layer 212 can be formed over the metal1 layer 208. Contacts 206 couple the metal1 layer 208 to the active layer 202 and/or couple the metal1 layer to the gate layer 204. Vias 210 couple the metal2 layer 212 to the metal1 layer 208.

The close lateral proximity of neighboring edges of the nearest first metal lines 208 can give rise to metal1 leakage current during device operation. To measure the extent of this leakage current, aspects of the present disclosure provide techniques for measuring this leakage current by applying a variety of voltage bias conditions to pins of the metal isolation test circuit. Because this metal isolation test circuit 100 has a layout that mimics spacing of features for an SRAM cell, albeit with several contacts removed (positions where contacts of a traditional SRAM cell have been removed correspond to gaps 118, 120, 122, and 124), the metal isolation test circuit provides an accurate depiction of leakage current in actual SRAM cell. Thus, when the metal isolation test circuit 100 is on the same chip as an SRAM cell, the layout of the metal isolation test circuit 100 is the same as that of the SRAM cell, including overall size and locations and spacings of the transistors and interconnect layers, except that SRAM cell 100B has contacts in locations 118, 120, 122, and 124, while the metal isolation test structure 100 lacks contacts in these locations. The following figures depict several examples of how these techniques can be implemented.

Figure 4:
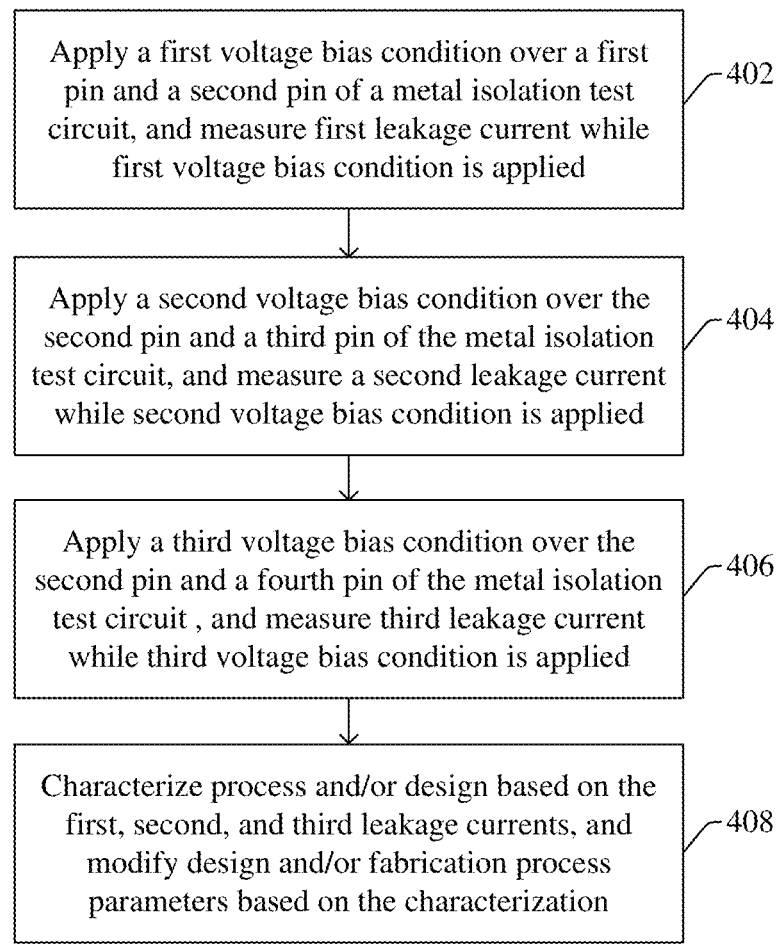
FIG. 4 illustrates a flow diagram of some embodiments of using a metal isolation test circuit.

FIG. 4 provides a flow chart 400 illustrating a method of characterizing leakage current for an SRAM cell and for a manufacturing process by which the SRAM cell is made by use of a metal isolation test circuit.

At 402, a first bias condition is applied over a first pin and a second pin of a metal isolation test circuit, and a first leakage current is measured while first bias condition is applied. In some embodiments, the metal isolation test circuit is an SRAM cell with one or more contacts removed, such as previously described in FIG. 1A and FIGS. 2A-2B. Thus, the metal isolation test circuit corresponds to an SRAM cell in terms of transistor layout and spacing between its metal layers and device features, but is not a functional SRAM device due to the fact the contacts have been removed. An example of this step is illustrated further herein in FIG. 5.

At 404, a second bias condition is applied over the second pin and a third pin of the metal isolation test circuit, and a second leakage current is measured while the second bias condition is applied. An example of this step is illustrated further herein in FIG. 6.

At 406, a third bias condition is applied over the second pin and a fourth pin of the metal isolation test circuit, and a third leakage current is measured while the third bias condition is applied. An example of this step is illustrated further herein in FIG. 7.

At 408, the metal isolation test circuit and/or manufacturing process used to manufacture the metal isolation test circuit is characterized based on the first, second, and third leakage currents. Then, based on this characterization, the design for the SRAM cell and/or fabrication process parameters used in the manufacturing process can be modified based on the characterization. For example, if the characterization shows that the metal1 layer of the design exhibits excessive leakage current, the design layout of the SRAM cell can be altered to increase the lateral spacing between nearest neighboring edges of the metal1 lines. Alternatively, rather than changing the design layout of the SRAM cell, the manufacturing process can be altered to reduce the dielectric constant and/or resolve other process issues with the SRAM design to reduce the leakage current.

FIGS. 5-7 illustrate a series of layout views 500-700 that collectively illustrate a method 400 consistent with FIG. 4 be carried out with the metal isolation test circuit 100 previously illustrated and described with FIG. 1 and FIGS. 2A-2B. Because the method strives to characterize leakage current for metal isolation (in this example, metal1 leakage current), FIGS. 5-7's layout views illustrate only the metal1 and metal2 layers from FIGS. 2A-2B layout view for clarity.

In FIG. 5, a first bias condition is applied over a first pin (pin1) and second pin (pin2) of the metal isolation test circuit. Thus, for example, a high voltage is applied to the first pin (pin1) and a low voltage is applied to the second pin (pin2). The first pin (pin21) is coupled to metal1 features 502, 504 through vias 506, 508; and the second pin (pin2) is coupled to metal1 features 510, 512 through vias 514, 516. Due to the voltage bias and close proximity of the metal1 features 502, 504 and 510, 512, the first bias condition can induce a first leakage current (i1) between the metal1 features. In some examples, the first bias condition can be implemented by applying a voltage of ranging from approximately 6 Volts (V) to approximately 30 V to the first pin (pin1), with approximately 14 V being applied to the first pin (pin1) in some embodiments. The bias condition can also applying a voltage of 0 V to the second pin (pin2), while the third pin (pin3) and fourth pin (pin4) are left floating. Other conditions/voltages are within the scope of this disclosure, and these example voltages are not in any way limiting. As can be appreciated by reviewing FIG. 5 in view of FIGS. 2A-2B, pin 1 is tied to the WL and Vss nodes of the metal isolation test circuit, while pin2 is tied to the data storage node 2 (N2) and BL. Accordingly, applying this first bias condition to the metal isolation test circuit is used to characterize leakage current between WL/VSS nodes and the N2/BL nodes of an SRAM cell.

In FIG. 6, a second bias condition is applied over the second pin (pin2) and a third pin (pin3) of the metal isolation test circuit. Thus, a high voltage is applied to the third pin (pin3) and a low voltage is applied to the second pin (pin2). The second pin is still coupled to metal1 features 510, 512 through vias 514, 516; while the third pin is coupled to metal1 features 518, 520 through vias 522, 524. Due to the voltage bias and close proximity of the metal1 lines to one another, the second bias condition can induce a second leakage current (i2) between the metal1 features 510, 512 and 518, 520. In some examples, the second bias condition can be implemented by applying a voltage of approximately 14 V to the third pin and applying a voltage of 0V to the second pin, while the first pin and fourth pin are left floating. As can be appreciated by reviewing FIG. 6 in view of FIGS. 2A-2B, pin3 is tied to the VDD node of the metal isolation test circuit, while pin2 is tied to the data storage node 2 (N2) and BL. Accordingly, applying this second bias condition to the metal isolation test circuit is used to characterize leakage current between N2/BL (pin 2) and VDD (pin 3) nodes of an SRAM cell.

In FIG. 7, a third bias condition is applied over the second pin (pin2) and a fourth pin (pin4) of the metal isolation test circuit. Thus, a high voltage is applied to the fourth pin (pin4) and a low voltage is applied to the second pin (pin2). The second pin is still coupled to metal1 features 510, 512 through vias 514, 516; while the fourth pin is coupled to metal1 features 526, 528 through vias 530, 532. Due to the voltage bias and close proximity of the metal1 lines to one another, the third bias condition can induce a third leakage current (i3) between the metal1 features 510, 512. In some examples, the third bias condition can be implemented by applying a voltage of approximately 14 V to the fourth pin and applying a voltage of 0V to the second pin, while the first pin and third pin are left floating. As can be appreciated by reviewing FIG. 5 in view of FIGS. 2A-2B, pin4 is tied to the data storage node 1 (N1) and BLB; while pin 2 is tied to the data storage node 2 (N2) and BL. Accordingly, applying this third bias condition to the metal isolation test circuit is used to characterize leakage current between N2/BL (pin 2) and N1/BLB (pin 4) nodes of an SRAM cell.

Again, these leakage currents it (FIG. 5), i2 (FIGS. 6), and i3 (FIG. 7) are measured on the metal isolation test circuit 100 (which is laid out according to an SRAM layout with several contacts removed), can ultimately be used to modify the SRAM layout and/or manufacturing process used to manufacture the metal isolation test circuit and/or SRAM. For example, if the characterization shows that the first measured leakage current it is greater than a maximum accept leakage current, the design layout of the SRAM cell can be altered to increase the lateral spacing between nearest neighboring edges of the metal1 features 502, 504 and 510, 512. Similarly, if the characterization shows that the second measured leakage current i2 is greater than the maximum accept leakage current, the design layout of the SRAM cell can be altered to increase the lateral spacing between nearest neighboring edges of the metal1 features 510, 512 and 518, 520. Further, if the characterization shows that the third measured leakage current i3 is greater than the maximum accept leakage current, the design layout of the SRAM cell can be altered to increase the lateral spacing between nearest neighboring edges of the metal1 features 502, 504 and 526, 528.

Figure 8:
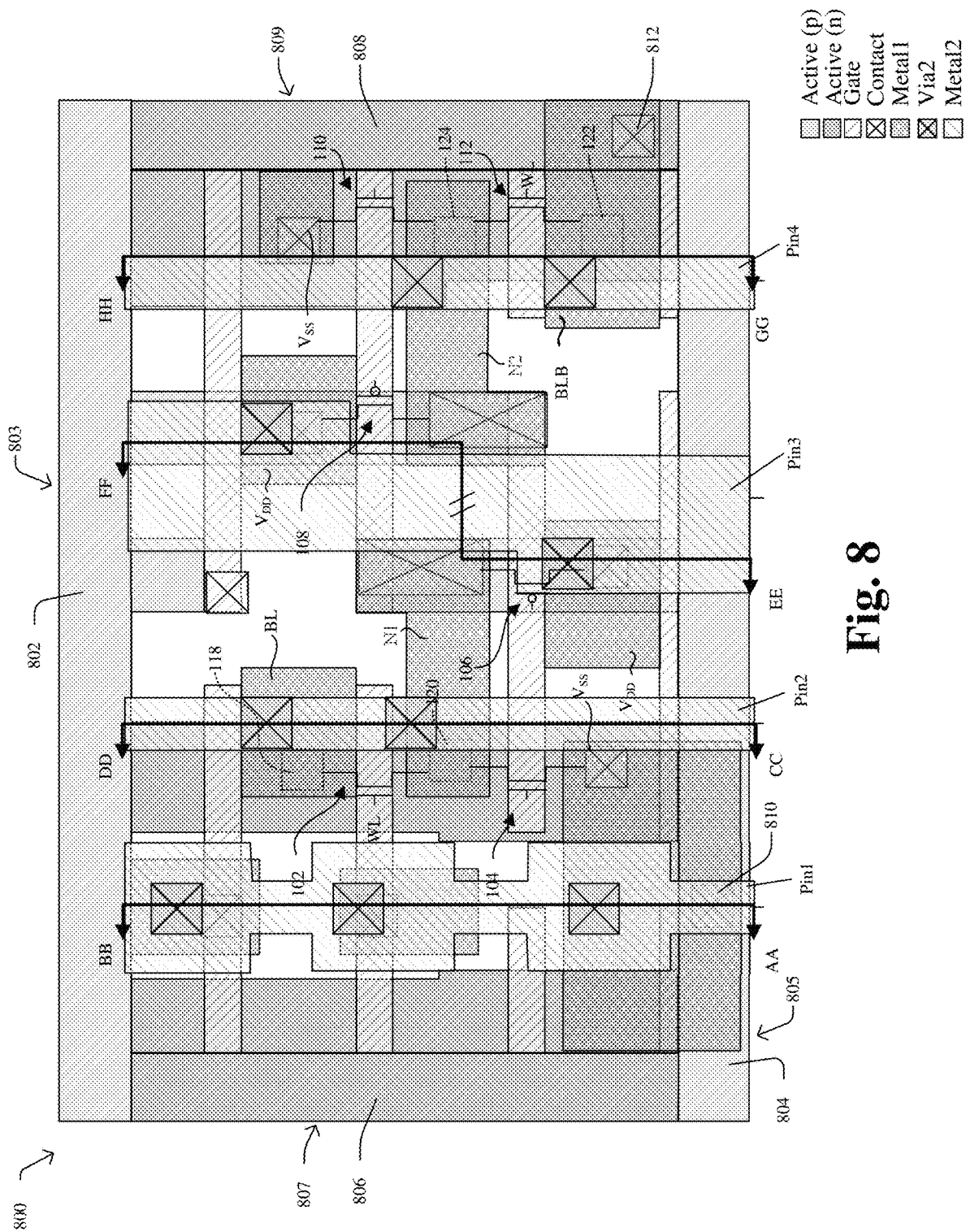
FIG. 8 illustrates another layout view of some embodiments of a metal isolation test circuit in accordance with some embodiments.

FIG. 8 shows a layout view of some other embodiments of a metal isolation test circuit 800 in accordance with the present disclosure. FIG. 8 is similar to layout 200A, 200B previously described FIGS. 2A-2B, however, whereas FIGS. 2A-2B were divided into lower layers (FIG. 2A) and upper layers (FIG. 2B) FIG. 8 shows lower and upper layers in a single layout view to show alignment of all layers in one figure. Also, in addition to the features previously described in FIG. 2A-2B, FIG. 8 also includes additional p-well region 802 at a first edge 803 of the layout; an additional p-well region 804 at a second edge 805 of the layout; an additional n-well region 806 at a third edge 807 and additional n-well region 808 at fourth edge 809 of the layout. The additional p-well region 802, 804 and additional n-well region 806, 808 can form a ring that laterally surrounds the six transistors 102, 104, 106, 108, 110, and 112 of the metal isolation test circuit. The Though FIG. 8 shows the additional p-well region 802, 804 and additional n-well region 806, 808 forming a ring that surrounds a metal isolation test circuit corresponding to a single SRAM cell with contacts removed; in other embodiments, the ring formed by 802-808 laterally surrounds a metal isolation test circuit corresponding to an array of multiple SRAM cells each having contacts removed. For example, in some embodiments, the ring formed by 802-808 surrounds several thousand SRAM cells with contacts removed, such as 10,000 such cells, as this may provide a more accurate representation of leakage current when actual SRAM cells are arranged in an array. For example, when only a single SRAM cell is surrounded by the ring (e.g., ring made up of well regions 802, 804, 806, 808) versus when an array of many SRAM cells is surrounded by the ring; a number of small differences may arise between the structures. For example, variations in the thickness of layers may arise due to chemical-mechanical-planarization-loading differences between the single SRAM cell and the SRAM array, such that the SRAM array being surrounded by the ring structure more closely resembles actual thickesses of layers (e.g., dielectric layers) in an actual SRAM array. Further, variations in electrical field edge effects due to electrodynamics in a single standalone SRAM cell vs. an array of SRAM cells may lead to small differences in current leakage, with the array of SRAM cells surrounded by ring made up of well regions 802, 804, 806, 808 more closely mimicking current leakage an actual SRAM array.

Figure 9A:
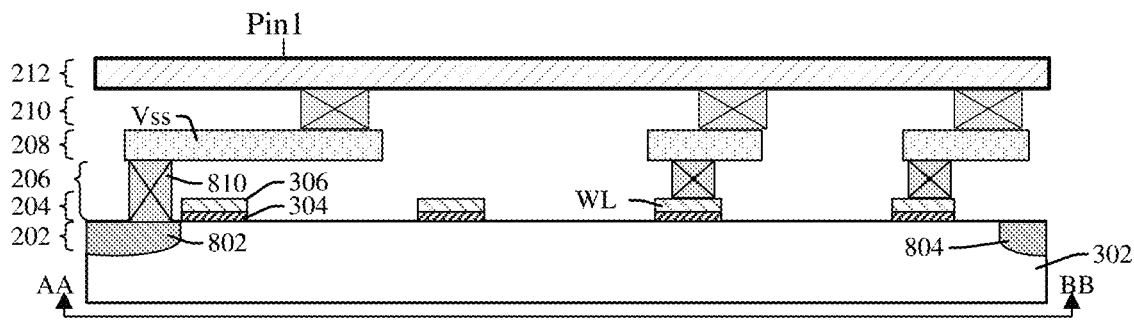
FIGS. 9A-9D illustrate a series of cross sectional views corresponding to the layout view of FIG. 8.
Figure 9B:
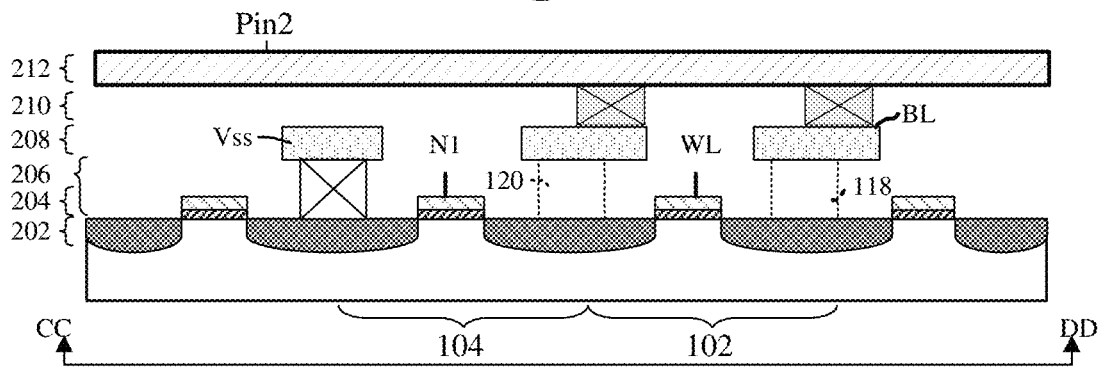
Figure 9C:
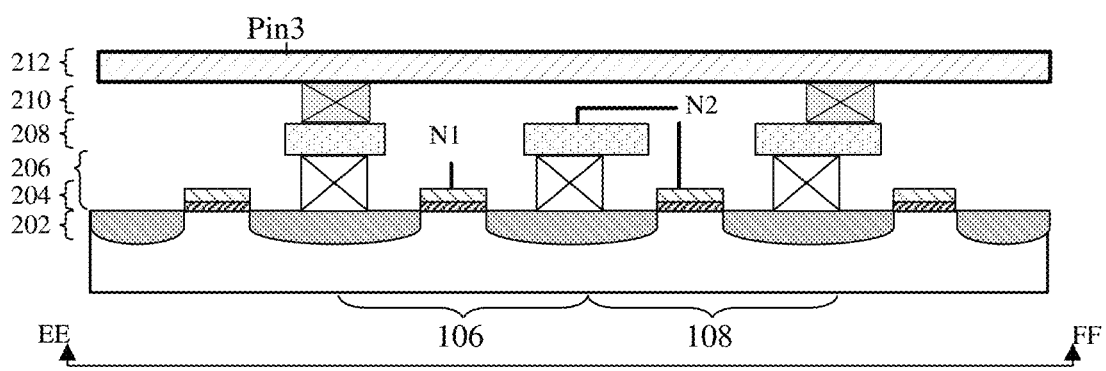
Figure 9D:
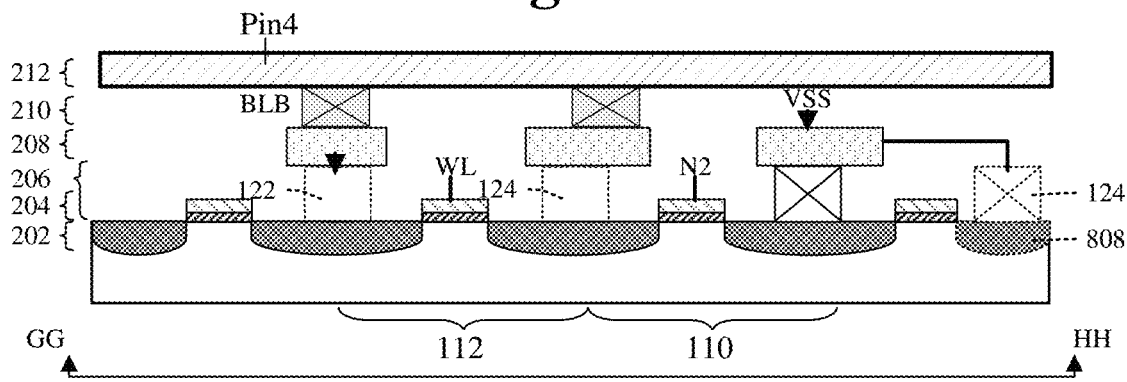

FIGS. 9A-9D illustrate cross-sectional views of the metal isolation test circuit 800 as shown along the cross-sectional lines illustrated in FIG. 8. As can be seen in FIG. 9A, contact 810 ohmically couples pin to the additional p-type region 802. As can be seen in FIG. 9D, contact 812 couples pin4 to the additional n-type region 808 (as indicated by dashed lines in FIG. 9D because features 812 and 808 are outside of the cross-sectional line GG-HH.

Again, leakage currents i1, i2, and i3, can be measured on the metal isolation test circuit 800 (which is laid out according to an SRAM layout with several contacts removed) according to the method of FIG. 4. The leakage currents i1, i2, and i3 can then be used to modify the SRAM layout and/or modify the manufacturing process used to manufacture the metal isolation test circuit (and/or actual SRAM cells).

Figure 10A:
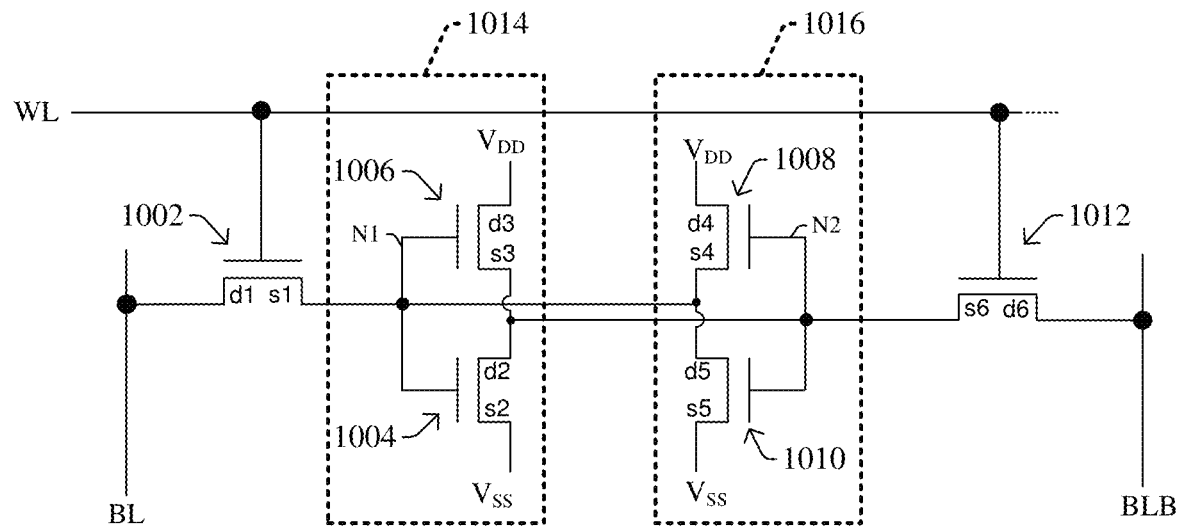
FIG. 10A illustrates some embodiments of a metal isolation test circuit made up solely of n-type transistors.

FIG. 10A shows a schematic view of some alternative embodiments of a metal isolation test circuit 1000A. This metal isolation test circuit 1000A has a schematic that is substantially the same as an actual SRAM cell (see FIG. 1B), however, rather than having a mix of p-type transistors and n-type transistors as in an actual SRAM cell, this metal isolation test circuit 1000A is made up solely of n-type transistors.

The metal isolation test circuit 1000A is made up of six n-type transistors, including a first n-type access transistor 1002 and a second n-type access transistor 1012. The metal isolation test circuit 1000A also includes first n-type data storage transistor 1004, second n-type data storage transistor 1006, third n-type data storage transistor 1008, and fourth n-type data storage transistor 1010. Each transistor has a source (e.g., first access transistor 1002 has source s1, first n-type data storage transistor 1004 has source s2, and so on), and each transistor has a drain (e.g., first access transistor 1002 has drain d1, first n-type data storage transistor 1004 has drain d2, and so on).

The first n-type data storage transistor 1004 and the second n-type data storage transistor 1006 form a first pseudo-inverter 1014 and the third n-type data storage transistor 1008 and the fourth n-type data storage transistor 1010 form a second pseudo-inverter 1016. The first pseudo-inverter 1014 is cross-coupled with the second pseudo-inverter 1016, thereby establishing complementary data storage nodes N1, N2. Wordline (WL) is coupled to the gates of access transistors 1002, 1012, and a pair of complementary bitlines BL, BLB extend along outer edges of the cell.

Figure 10B:
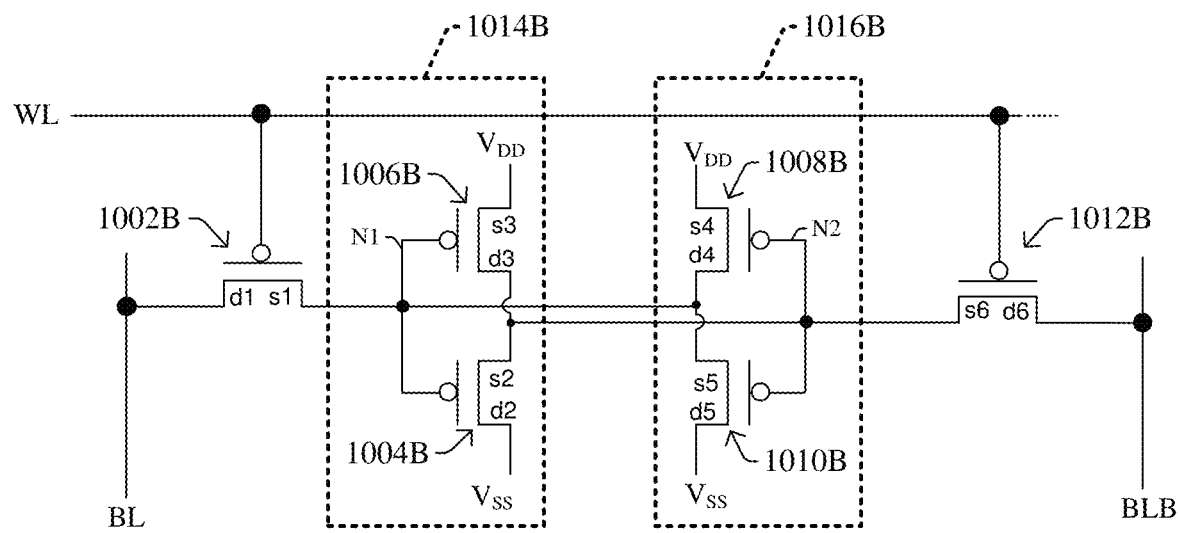
FIG. 10B illustrates some embodiments of a metal isolation test circuit made up solely of p-type transistors.

Alternatively, each of the illustrated n-type transistors of the metal isolation test circuit 1000A could be replaced by a p-type transistor, such as shown in FIG. 10B's metal isolation test circuit 1000B. The metal isolation test circuit 1000B is made up of six p-type transistors, including a first p-type access transistor 1002B and a second p-type access transistor 1012B. The metal isolation test circuit 1000B also includes first p-type data storage transistor 1004B, second p-type data storage transistor 1006B, third p-type data storage transistor 1008B, and fourth p-type data storage transistor 1010B.

Figure 11A:
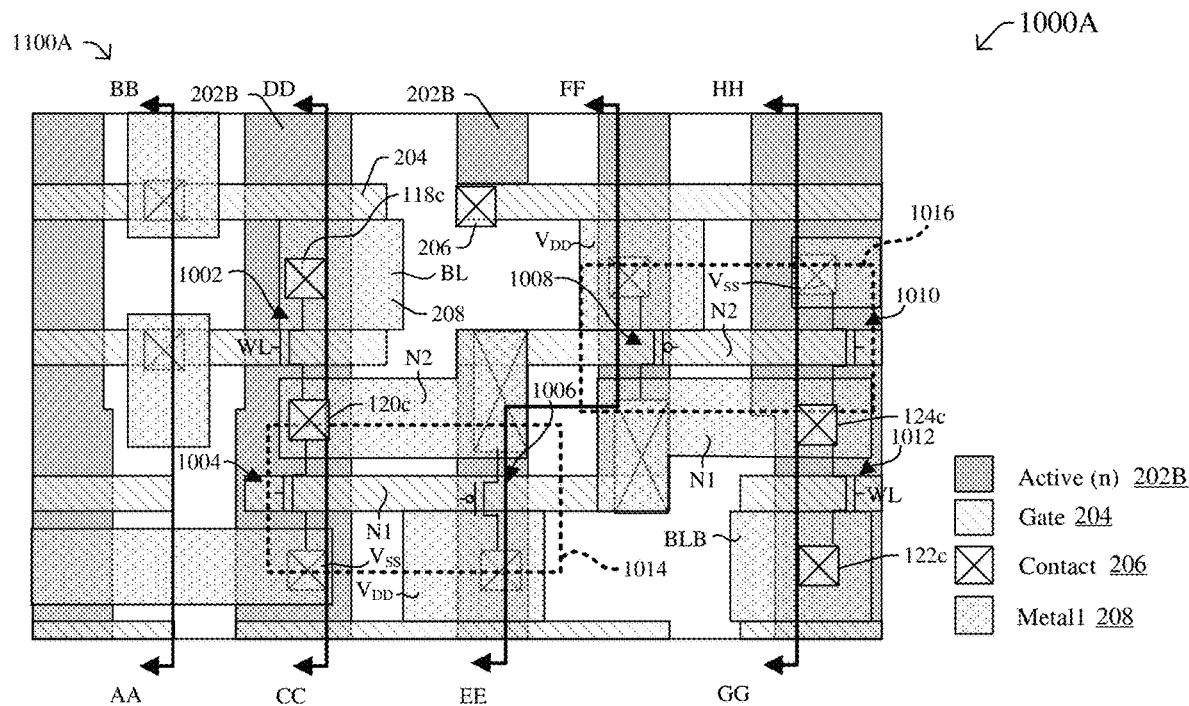
FIGS. 11A-11B provide layout views consistent with some embodiments of the metal isolation test circuit of FIG. 10A.
Figure 11B:
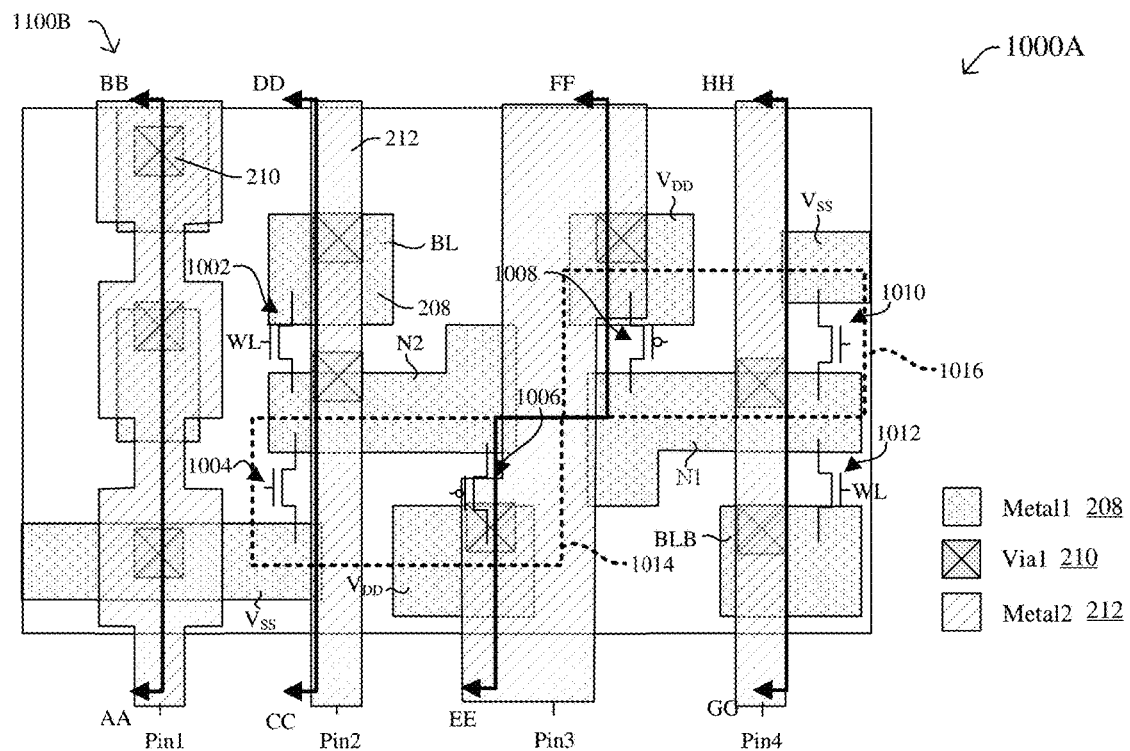

FIGS. 11A-11B provide layout views 1100A, 1100B consistent with some embodiments of the metal isolation test circuit 1000A. More particularly, FIG. 11A illustrates lower layers 1100A of the layout, while FIG. 11B illustrates upper layers 1100B of the layout. The lower layers in FIG. 11A include an active layer 202, gate layer 204, contact layer 206, and metal 1 layer 208. The upper layers in FIG. 11B include the metal1 layer 208, vias 210, and metal2 layer 212. Thus, the upper layers 1100B can be superimposed over the lower layers 1100A to provide a layout made up of six n-type transistors 1002, 1004, 1006, 1008, 1010, and 1012, which are operably coupled consistent with FIG. 10A's schematic view 1000A. For clarity, in FIGS. 11A-11B, metal1 layer 208 has been reproduced in both layouts 1100A, 1100B to clearly depict alignment of the various features/layers with one another, and it will be appreciated that additional layers may also be present but have been omitted for purposes of clarity.

Referring to FIG. 11A, the transistors 1002, 1004, 1006, 1008, 1010, and 1012 in FIG. 11A (which correspond to the same transistors in FIG. 10A's schematic) are formed by n-type active regions 202B bridged by a gate layer 204. The gate layer 204 runs across the n-type active regions 202B. In addition to forming the gates of transistors 1002, 1004, 1006, 1008, 1010, and 1012, the gate layer 204 interconnects the transistors 1002, 1004, 1006, 1008, 1010, and 1012 by coupling common gate terminals together. The gate layer 204 may be made of polysilicon and/or metal, depending on the implementation. Contacts 206, as well as contacts 118c, 120c, 122c, and 124c, electrically couple the active regions 202 and/or gate layer 204 to first metal lines 208 (e.g., metal1 layer).

Referring to FIG. 11B, vias 210 electrically couple the first metal lines 208 (e.g., metal1 layer) to second metal lines 212 (e.g., metal2 layer). As can be seen in FIG. 2B, nearest neighboring metal1 lines have edges that are closely spaced. Further the metal2 lines correspond to pins by which voltage biases can be applied, namely: first pin (pin1), second pin (pin 2), third pin (pin3), and fourth pin (pin4). Again, leakage currents i1, i2, and i3, can be measured on the metal isolation test circuit 1000A or according to the method of FIG. 4. The leakage currents i1, i2, and i3 can then be used to modify the SRAM layout and/or modify the manufacturing process used to manufacture the metal isolation test circuit (and/or actual SRAM cells).

Figure 12:
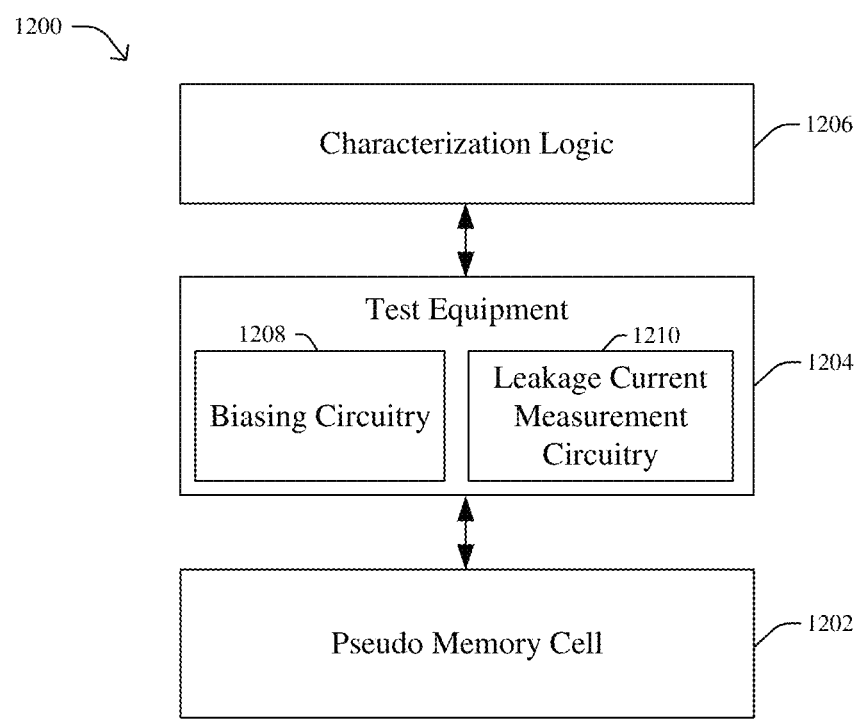
FIG. 12 illustrates a system for characterizing metal leakage current in an integrated circuit design and/or manufacturing process in accordance with some embodiments.

FIG. 12 illustrates a system 1200 for characterizing metal leakage current in an integrated circuit design and/or manufacturing process. The system includes a pseudo memory cell 1202, test equipment 1204, and characterization logic 1206.

The pseudo memory cell 1202 includes a plurality of transistors disposed on a semiconductor substrate, such as illustrated in FIGS. 2A-2B (e.g., 100) for example. Thus, the pseudo memory cell 1202 includes an interconnect structure that is made up of a plurality of metal lines stacked over one another and disposed over the plurality of transistors. The interconnect structure includes a plurality of separate metal1 segments, and a plurality of pins that are coupled to the plurality of metal1 segments. In the case where the pseudo memory cell is tested prior to dicing, the substrate is a semiconductor wafer, while in other cases the substrate is a singulated die that is only a portion of the semiconductor wafer.

The test equipment 1204 can take the form of external integrated circuit (IC) test equipment, on-chip circuitry, or combinations thereof. When in the form of external IC test equipment, the test equipment 1200 has pins or needles that are temporarily pressed into physical and electrical contact with the pins of the pseudo memory cell only during testing. When these pins are in contact, the biasing circuitry 1208 applies a first voltage bias across a first pin and a second pin of the pseudo memory cell 1202 to induce leakage current between a first metal1 segment and a second metal1 segment of the pseudo memory cell (see e.g., application of first bias condition in FIG. 5). While this first voltage bias is applied, the leakage current measurement circuitry 1210 measures a first leakage current condition. After the first leakage current condition is measured, the biasing circuitry 1208 applies a second voltage bias across the second pin and a third pin to induce leakage current between the second metal1 segment and a third metal1 segment (see e.g., application of first bias condition in FIG. 6). While this second voltage bias is applied, the leakage current circuitry 1210 measures a second leakage current. Additional voltage biases and corresponding additional leakage currents can also be applied/measured to better characterize leakage current for the technology node.

The characterization logic 1206 then characterizes a process or a design rule by which the pseudo memory cell 1202 is manufactured based on the first leakage current and the second leakage current. Based on this characterization, the design for the pseudo memory cell and/or fabrication process parameters used in the manufacturing process can be modified based on the characterization. For example, if the characterization shows that the metal1 layer of the pseudo memory cell design exhibits excessive leakage current, the design layout of the pseudo memory cell (and/or an actual memory cell and/or a logic transistor) can be altered to increase the lateral spacing between nearest neighboring edges of the metal1 lines. Alternatively, rather than changing the design layout of the pseudo memory cell and/or actual memory cell, the manufacturing process can be altered to reduce the dielectric constant and/or resolve other process issues with the actual memory design to reduce the leakage current.

In view of the foregoing, some methods receive a metal isolation test circuit comprising a pseudo static random access memory (SRAM) cell disposed on a semiconductor substrate. The pseudo SRAM cell includes a plurality of transistors and an interconnect structure disposed over the plurality of transistors. The interconnect structure includes a plurality of pins that are coupled to a plurality of nodes in the pseudo SRAM cell. A first voltage bias is applied across first and second pins of the plurality of pins, and a first leakage current is measured while the first voltage bias is applied. A second voltage bias is applied across third and fourth pins, and a second leakage current is measured while the second voltage bias is applied. A process or a design rule by which the pseudo SRAM cell is made is characterized based on the first leakage current and the second leakage current.

Some other embodiments relate to a system for measuring leakage current. The system includes a pseudo static random access memory (SRAM) cell, test circuitry, and characterization logic. The pseudo SRAM cell is disposed on a semiconductor substrate, and includes a plurality of transistors and an interconnect structure over the plurality of transistors. The interconnect structure includes a plurality of pins that are coupled to a plurality of metal1 segments in the interconnect structure of the pseudo SRAM cell. The test circuity is configured to apply a first voltage bias across a first pin and a second pin to induce leakage current between a first metal1 segment and a second metal1 segment, and measure a first leakage current while the first voltage bias is applied. The test circuitry is further configured to apply a second voltage bias across the second pin and a third pin to induce leakage current between the second metal1 segment and a third metal1 segment, and measure a second leakage current while the second voltage bias is applied. The characterization logic characterizes a process or a design rule by which the pseudo SRAM cell is manufactured based on the first leakage current and the second leakage current.

Further embodiments relate to a metal isolation test circuit. The metal isolation test circuit includes a semiconductor substrate including a plurality of transistors. An interconnect structure is disposed over the semiconductor substrate and over the plurality of transistors. The interconnect structure includes a plurality of metal layers stacked over one another. The plurality of metal layers include a plurality of metal1 segments and a plurality of metal2 segments arranged over the plurality of metal1 segments. A first subgroup of metal1 segments within the interconnect structure are spaced apart from one another by a minimum lateral spacing that is less an non-minimum lateral spacing separating a second subgroup of metal1 segments within the interconnect structure. A plurality of pins correspond to the plurality of metal2 segments, respectively. The plurality of pins are configured to apply a first voltage bias to induce a first leakage current between first and second metal1 segments within the first subgroup of metal1 segments and are further configured to apply a second voltage bias to induce a second leakage current between third and fourth metal1 segments within the first subgroup of metal1 segments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A metal isolation test circuit, comprising:
   a semiconductor substrate including a plurality of transistors;
   an interconnect structure disposed over semiconductor substrate and over the plurality of transistors, the interconnect structure including a plurality of metal layers stacked over one another, the plurality of metal layers including a plurality of lower metal segments and a plurality of upper metal segments arranged over the plurality of lower metal segments;
   wherein a first subgroup of lower metal segments within the interconnect structure are spaced apart from one another by a minimum lateral spacing that is less an non-minimum lateral spacing separating a second subgroup of lower metal segments within the interconnect structure; and
   a plurality of pins corresponding to the plurality of upper metal segments, respectively, wherein the plurality of pins are configured to apply a first voltage bias to induce a first leakage current between first and second lower metal segments within the first subgroup of lower metal segments and are further configured to apply a second voltage bias to induce a second leakage current between third and fourth lower metal segments within the first subgroup of lower metal segments.

2. The metal isolation test circuit of claim 1, wherein the plurality of transistors are laid out to provide a pseudo static random access memory (SRAM) cell comprising an access transistor whose source region and drain region are each floating.

3. The metal isolation test circuit of claim 1, wherein the plurality of transistors are laid out to provide a pseudo static random access memory (SRAM) cell comprising a pair of cross-coupled inverters establishing first and second complementary data storage nodes, and comprising a pair of access transistors whose source regions and drain regions are each floating.

4. The metal isolation test circuit of claim 1, wherein the plurality of transistors are laid out to provide a pseudo static random access memory (SRAM) cell and an actual SRAM cell, the pseudo SRAM cell and the actual SRAM cell having the same number of transistors, the same active area layouts, and the same lower metal layouts as one another, but where contacts are selectively removed in the pseudo SRAM cell relative to the actual SRAM cell.

5. The metal isolation test circuit of claim 1, wherein the plurality of transistors are laid out to provide a pseudo static random access memory (SRAM) cell, wherein the pseudo SRAM cell comprises six transistors each having a first conductivity type, the six transistors including a first access transistor, a second access transistor, a first data storage transistor, a second data storage transistor, a third data storage transistor, and a fourth data storage transistor.

6. The metal isolation test circuit of claim 5, wherein the first conductivity type is n-type.

7. The metal isolation test circuit of claim 1, wherein a first pin of the plurality of pins is coupled to a first lower metal segment, and a second pin of the plurality of pins is coupled to a second lower metal segment that is laterally spaced apart from and is a nearest neighbor with the first lower metal segment, such that applying the first voltage bias induces at least a portion of the first leakage current between nearest sidewalls of the first lower metal segment and the second lower metal segment.

8. The metal isolation test circuit of claim 4, further comprising:
a first well region of the first conductivity type disposed about a first edge and a second edge of the pseudo SRAM cell;
a second well region of the first conductivity type disposed about a third edge and a fourth edge of the pseudo SRAM cell, the first well region and the second well region adjoining one another to form an enclosed ring that surrounds the pseudo SRAM cell.

9. A system for measuring leakage current, comprising:
a metal isolation test circuit disposed on a semiconductor substrate, wherein the metal isolation test circuit includes a plurality of transistors and an interconnect structure over the plurality of transistors, the interconnect structure including a plurality of pins that are coupled to a plurality of metal segments in the interconnect structure of the metal isolation test circuit;
test circuity configured to:
apply a first voltage bias across a first pin and a second pin to induce leakage current between a first metal segment and a second metal segment, and measure a first leakage current while the first voltage bias is applied;
apply a second voltage bias across the second pin and a third pin to induce leakage current between the second metal segment and a third metal segment, and measure a second leakage current while the second voltage bias is applied; and
characterization logic to characterize a process or a design rule by which the metal isolation test circuit is manufactured based on the first leakage current and the second leakage current.

10. The system of claim 9, wherein the metal isolation test circuit comprises a pseudo SRAM cell and an actual SRAM cell design that have the same number of transistors laid out in the same configuration as one another, but wherein contacts are selectively removed in the pseudo SRAM cell relative to the actual SRAM cell design.

11. The system of claim 10, wherein the pseudo SRAM cell comprises six transistors each having a first conductivity type, the six transistors including a first access transistor, a second access transistor, a first data storage transistor, a second data storage transistor, a third data storage transistor, and a fourth data storage transistor.

12. The system of claim 9, wherein the first pin is coupled to the first metal segment, and the second pin is coupled to a second metal segment that is laterally spaced apart from and nearest neighbors with the first metal segment, and wherein the first metal segment is a first metal1 segment and the second metal segment is a second metal1 segment, such that the applying of the first voltage bias induces at least a portion of the first leakage current between nearest sidewalls of the first metal1 segment and the second metal1 segment.

13. The system of claim 9, wherein a difference between the first voltage bias and the second voltage bias is more than 10 volts.

14. A semiconductor device, comprising:
an actual SRAM cell, comprising: a first pair of cross-coupled inverters configured to store data in a first pair of complementary data storage nodes, and a first pair of access transistors configured to allow selective access to the first pair of complementary data storage nodes; and
a pseudo SRAM cell comprising: a second pair of cross-coupled inverters, and a second pair of access transistors, wherein the pseudo SRAM cell and the actual SRAM cell have the same number of transistors laid out in the same layout configuration as one another, but wherein a plurality of electrical pathways are selectively removed in the pseudo SRAM cell relative to the actual SRAM cell to provide a plurality of electrical gaps in the pseudo SRAM cell.

15. The semiconductor device of claim 14, further comprising test circuitry configured to apply a first voltage bias across a first of the electrical gaps, and measure a first leakage current while the first voltage bias is applied.

16. The semiconductor device of claim 15, wherein the test circuitry is further configured to characterize a process or a design rule by which the pseudo SRAM cell is made based on the first leakage current.

17. The semiconductor device of claim 14, wherein the plurality of electrical pathways that are selectively removed consists of a plurality of contacts that are selectively removed in the pseudo SRAM cell relative to the actual SRAM cell.

18. The semiconductor device of claim 14, wherein the pseudo SRAM cell comprises six transistors each having a first conductivity type, the six transistors including a first access transistor, a second access transistor, a first data storage transistor, a second data storage transistor, a third data storage transistor, and a fourth data storage transistor.

19. The semiconductor device of claim 15, wherein the test circuitry is further configured to apply a second voltage bias across a second of the electrical gaps, and a difference between the first voltage bias and the second voltage bias is more than 10 volts.

20. The semiconductor device of claim 14, wherein a first pin is coupled to a first electrical feature on one side of a first electrical gap of the plurality of electrical gaps and a second pin is coupled to a second electrical feature on an opposite side of the first electrical gap, such that application of a voltage bias between the first pin and the second pin induces a leakage current between the first electrical feature and the second electrical feature.

* * * * *